US012406726B2

(12) United States Patent
Rao et al.

(10) Patent No.: US 12,406,726 B2
(45) Date of Patent: Sep. 2, 2025

(54) SUPPRESSING RANDOM TELEGRAPH NOISE IN CROSSBAR CIRCUITS

(71) Applicant: TetraMem Inc., Fremont, CA (US)

(72) Inventors: Mingyi Rao, Fremont, CA (US); Mingche Wu, San Jose, CA (US); Ning Ge, Danville, CA (US)

(73) Assignee: TetraMem Inc., San Jose, CA (US)

( * ) Notice: Subject to any disclaimer, the term of this patent is extended or adjusted under 35 U.S.C. 154(b) by 123 days.

(21) Appl. No.: 18/361,282

(22) Filed: Jul. 28, 2023

(65) Prior Publication Data
US 2025/0037765 A1 Jan. 30, 2025

(51) Int. Cl.
G11C 7/10 (2006.01)
G11C 13/00 (2006.01)

(52) U.S. Cl.
CPC ...... G11C 13/0069 (2013.01); G11C 2213/79 (2013.01)

(58) Field of Classification Search
CPC ............ G11C 13/0069; G11C 2213/79; G11C 13/003; G11C 2013/0078; G11C 2013/0092; G11C 13/0033; G11C 13/004; G11C 13/0064
See application file for complete search history.

(56) References Cited

U.S. PATENT DOCUMENTS

| 2002/0124033 | A1* | 9/2002 | Takahashi | G06F 7/58 708/250 |
| 2011/0058427 | A1 | 3/2011 | Choi et al. | |
| 2011/0292724 | A1 | 12/2011 | Kim | |
| 2014/0289445 | A1* | 9/2014 | Savich | G06F 17/16 710/317 |
| 2015/0170025 | A1 | 6/2015 | Wu et al. | |
| 2017/0308789 | A1* | 10/2017 | Langford | G06N 3/045 |
| 2018/0114569 | A1* | 4/2018 | Strachan | G11C 11/54 |

(Continued)

FOREIGN PATENT DOCUMENTS

CN 101366091 B 5/2012

OTHER PUBLICATIONS

International Searching Authority (ISA)/US, International Search Report for PCT/US2024/040084, mailed Oct. 17, 2024, 2 pages.

(Continued)

*Primary Examiner* — Hien N Nguyen
(74) *Attorney, Agent, or Firm* — Jaffery Watson Hamilton & DeSanctis LLP

(57) ABSTRACT

The present disclosure provides mechanisms for reducing and suppressing random telegraph noise (RTN) for a crossbar circuit. A processing device may perform a programming process to program the conductance of a resistive random-access memory (RRAM) device in the crossbar circuit to a target conductance value. The processing device may then determine whether a random telegraph noise (RTN) value associated with the RRAM device is within a predetermined range of acceptable RTN values. If the RTN value associated with the RRAM device is not within a predetermined range of acceptable RTN values, one or more noise-reduction voltages may be applied to the RRAM device until the RTN value associated with the RRAM device is within the predetermined range of acceptable RTN values.

20 Claims, 11 Drawing Sheets

(56) References Cited

U.S. PATENT DOCUMENTS

| | | | |
|---|---|---|---|
| 2019/0147329 A1* | 5/2019 | Hekmatshoartabari | G06V 10/82 706/26 |
| 2019/0347555 A1* | 11/2019 | Park | G06N 5/04 |
| 2020/0193300 A1* | 6/2020 | Kumar | G06N 3/065 |
| 2020/0218967 A1* | 7/2020 | Strachan | G06N 3/08 |
| 2022/0293173 A1 | 9/2022 | Hu et al. | |

OTHER PUBLICATIONS

International Searching Authority (ISA)/US, Written Opinion for PCT/US2024/040084, mailed Oct. 17, 2024, 3 pages.

* cited by examiner

200D

SUPPRESSING RANDOM TELEGRAPH NOISE IN CROSSBAR CIRCUITS

TECHNICAL FIELD

The implementations of the disclosure relate generally to crossbar circuits including resistive random-access memory (RRAM or ReRAM) and, more specifically, to mechanisms for reducing and suppressing random telegraph noise (RTN) in crossbar circuits.

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, a method for programming a crossbar circuit is provided. The method includes performing a first programming process to program a cross-point device of the crossbar circuit to a target conductance value, wherein at least one programming voltage is applied to the cross-point device during the first programming process, wherein the cross-point device includes an RRAM device; determining, by a processing device, a first random telegraph noise (RTN) value associated with the RRAM device; and in view of a determination that the first RTN value associated with the RRAM device is not within a predetermined range of acceptable RTN values, applying a first noise-reduction voltage to the cross-point device, wherein the at least one programming voltage is higher than the first noise-reduction voltage.

In some embodiments, the method further includes generating, by the processing device, a digital signal for instructing a voltage generator to generate the first noise-reduction voltage.

In some embodiments, the first RTN value associated with the cross-point device comprises a feature of a signal representative of a current flowing through the cross-point device.

In some embodiments, the method further includes generating the signal representative of the current flowing through the cross-point device using a trans-impedance amplifier.

In some embodiments, the feature of the signal representative of the current flowing through the cross-point device comprises an amplitude.

In some embodiments, the method further includes performing a second programming process to program the RRAM device to the target conductance value after the application of the first noise-reduction voltage to the cross-point device; determining, by the processing device, a second random telegraph noise (RTN) value associated with the RRAM device; and in view of a determination that the second RTN value associated with the RRAM device is not within the predetermined range of acceptable RTN values, applying a second noise-reduction voltage to the cross-point device.

In some embodiments, the method further includes performing one or more additional programming processes and applying one or more additional noise-reduction voltages to the cross-point device until the conductance of the cross-point device matches the target conductance value and an RTN value associated with the cross-point device is within the range of acceptable RTN values.

According to one or more aspects of the present disclosure, a system including a processing device is provided. The processing device is configured to perform a first programming process to program a cross-point device of a crossbar circuit to a target conductance value, wherein at least one programming voltage is applied to the cross-point device during the first programming process, wherein the cross-point device includes an RRAM device; determine a first random telegraph noise (RTN) value associated with the RRAM device; and in response to determining that the first RTN value associated with the RRAM device is not within a predetermined range of acceptable RTN values, causing a first noise-reduction voltage to be applied to the cross-point device, wherein the at least one programming voltage is higher than the first noise-reduction voltage.

In some embodiments, to cause the first noise-reduction voltage to be applied to the cross-point device, the processing device is to generate at least one digital signal for instructing a voltage generator to generate the first noise-reduction voltage.

In some embodiments, the first RTN value associated with the RRAM device comprises a feature of a signal representative of a current flowing through the cross-point device.

In some embodiments, the signal representative of the current flowing through the cross-point device is generated using a trans-impedance amplifier.

In some embodiments, the feature of the signal representative of the current flowing through the cross-point device comprises an amplitude.

In some embodiments, the processing device is further to: perform a second programming process to program the RRAM device to the target conductance value after the application of the first noise-reduction voltage to the cross-point device; determine a second random telegraph noise (RTN) value associated with the RRAM device; and in response to determining that the second RTN value associated with the RRAM device is not within the predetermined range of acceptable RTN values, causing a second noise-reduction voltage to be applied to the cross-point device, wherein the second noise-reduction voltage is not greater than a threshold voltage of a transistor connected to the RRAM device.

In some embodiments, the processing device is further to perform one or more additional programming processes and cause one or more additional noise-reduction voltages to be applied to the cross-point device until the conductance of the cross-point device matches the target conductance value and an RTN value associated with the cross-point device is within the range of acceptable RTN values.

According to one or more aspects of the present disclosure, a non-transitory computer-readable storage medium including instructions is provided. When accessed by a processing device, the non-transitory computer-readable storage medium causes the processing device to: perform a first programming process to program a cross-point device of a crossbar circuit to a target conductance value, wherein at least one programming voltage is applied to the cross-point device during the first programming process, wherein the cross-point device includes an RRAM device; determine, by the processing device, a first random telegraph noise (RTN) value associated with the RRAM device; and in response to determining that the first RTN value associated with the RRAM device is not within a predetermined range of acceptable RTN values, causing a first noise-reduction voltage to be applied to the cross-point device, wherein the at least one programming voltage is higher than the first noise-reduction voltage.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1:
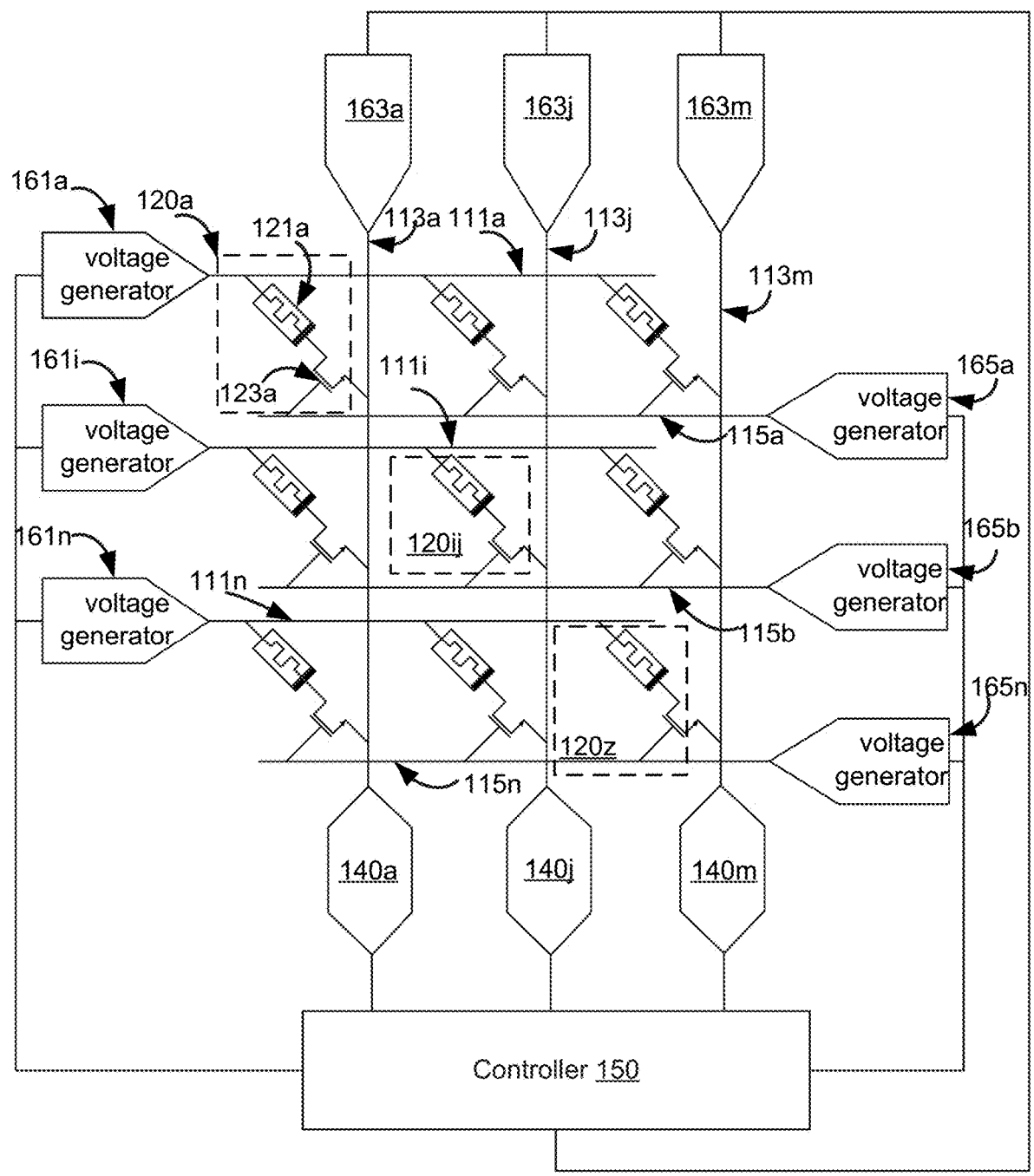
FIG. 1 is a diagram illustrating an example crossbar circuit in accordance with some embodiments of the present disclosure.
Figure 2A:
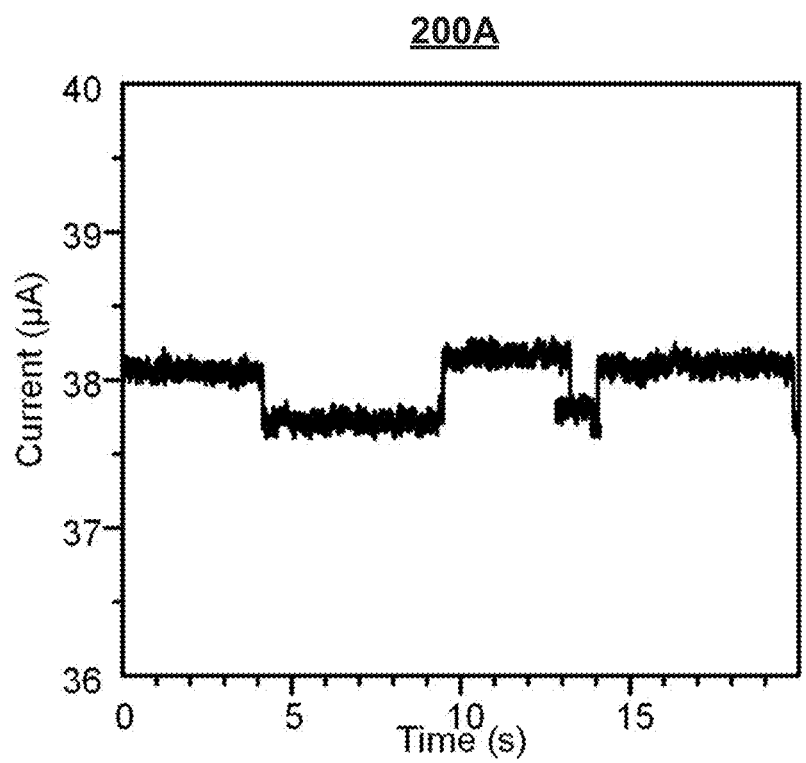
FIGS. 2A, 2B, 2C, 2D, and 2E are diagrams showing the output current over time of an RRAM device without undergoing a noise reduction process, when a constant voltage is applied to the RRAM device.
Figure 2B:
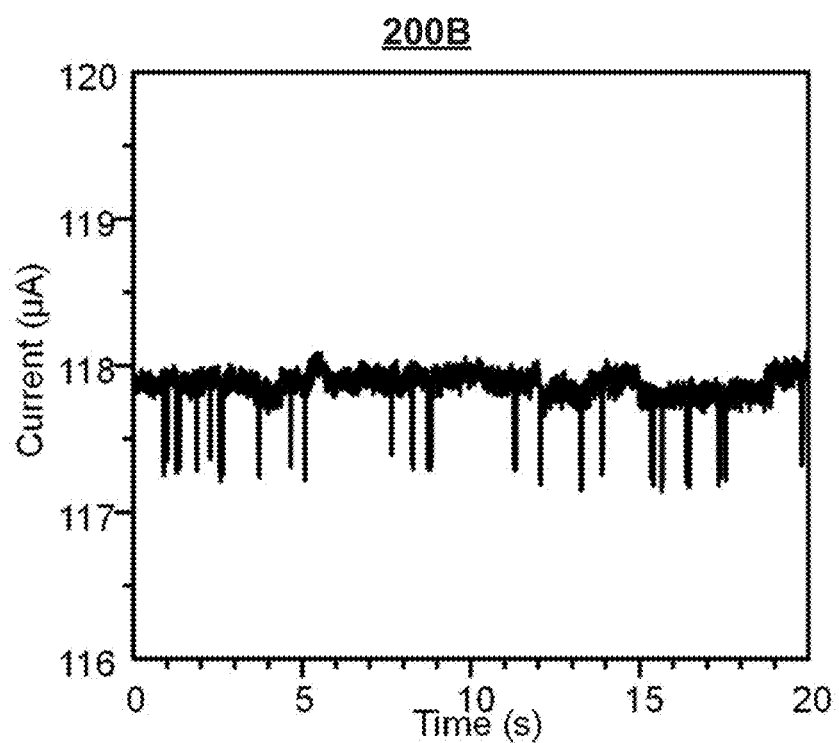
Figure 2C:
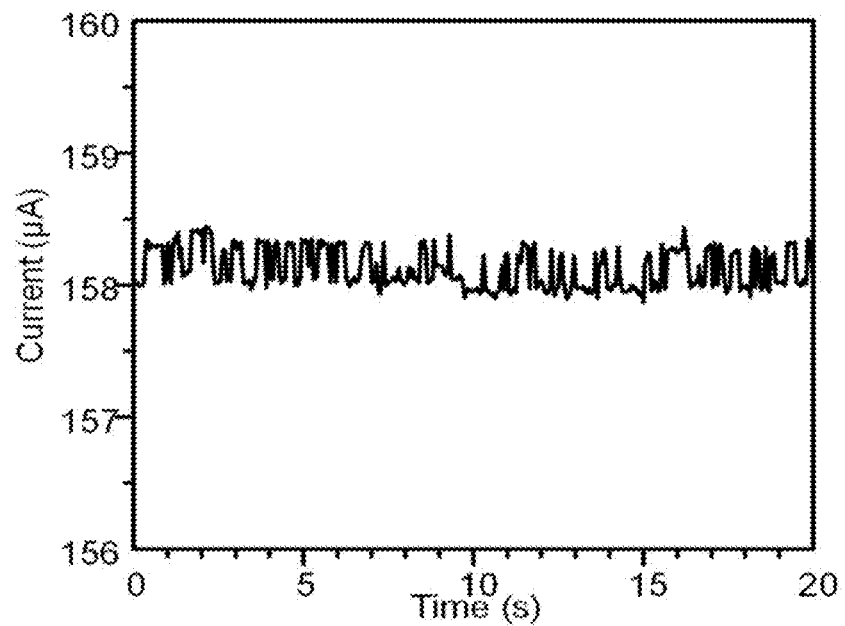
Figure 2D:
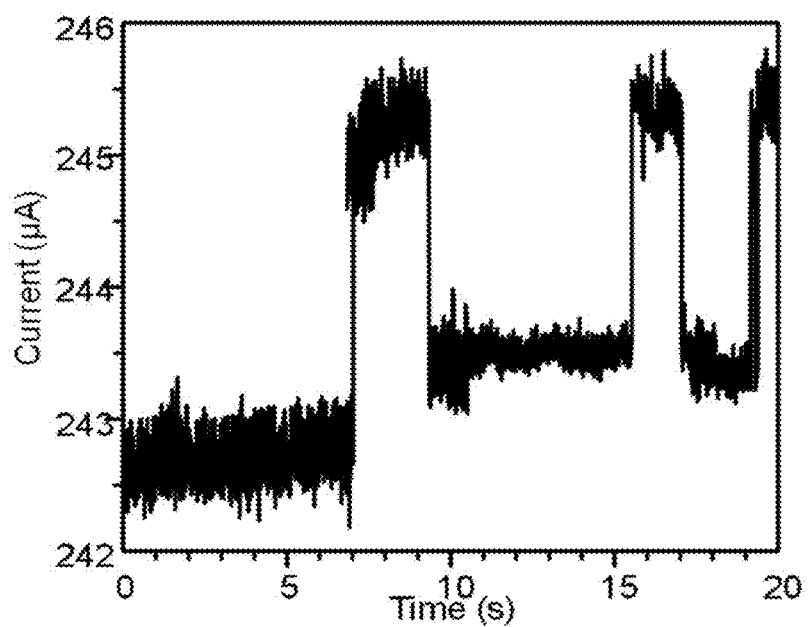
Figure 2E:
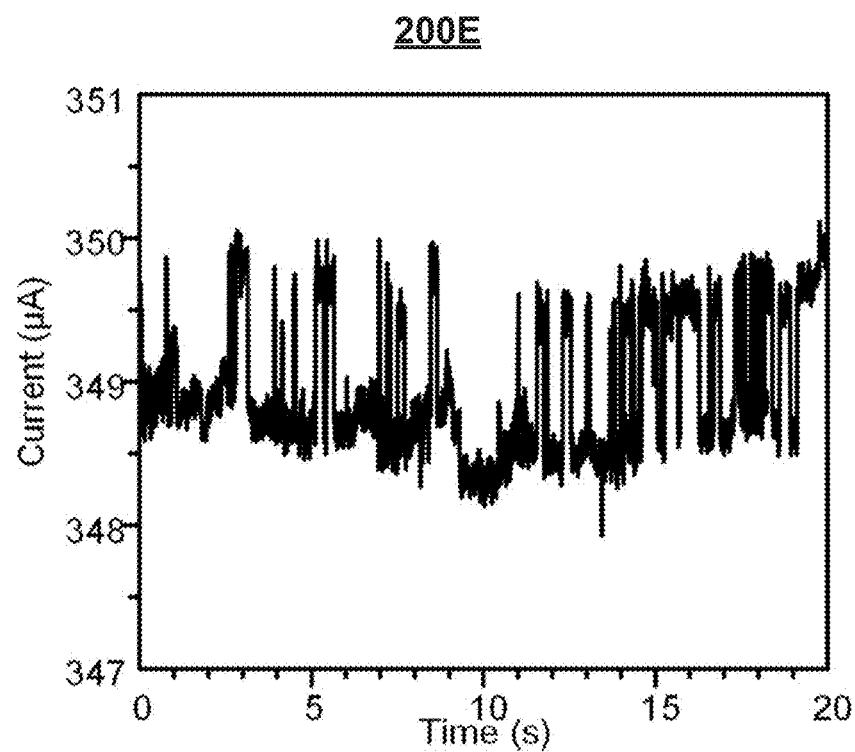

Aspects of the present disclosure provide mechanisms (e.g., apparatuses, systems, methods, non-transitory computer-readable media, etc.) for reducing and suppressing random telegraph noise (RTN) in crossbar circuits.

A crossbar circuit may include intersecting electrically conductive wires (e.g., row wires, column wires, etc.) and cross-point devices arranged in one or more arrays. Each of the cross-point devices may be connected to a row wire and a column wire. The cross-point devices may include, for example, a phase-change memory (PCM) device, a floating gate device, a spintronic device, a ferroelectric device, or a resistive random-access memory (RRAM) device (also referred to as a memristor).

Resistive random-access memory (RRAM) device may present stochastic switching behavior. That is, the resistance of the RRAM device may randomly switch between multiple levels under constant voltage. This may lead to random fluctuations in the memristor's output current under constant voltage over time, resulting in the occurrences of RTN.

An RRAM-based crossbar circuit may perform vector-matrix multiplication (VMM). For example, an input voltage may be applied to each selected row of the crossbar circuit. The input voltage may flow through the cross-point devices of the row of the crossbar circuit. The conductance of each cross-point device may be tuned to a specific value (also referred to as a "weight"). According to Ohm's law and Kirchhoff's current law, the input-output relationship of the crossbar circuit can be represented as $I=VG$, wherein I represents the output signal matrix as current; V represents the input signal matrix as voltage; and G represents the conductance matrix of the cross-point devices. As such, the input voltage is weighted at each of the cross-point devices by its conductance according to Ohm's law. The weighted current is output via each column wire and may be accumulated according to Kirchhoff's current law. However, the conductance of the programmed RRAM devices may randomly change over time, resulting in the occurrences of RTN. This may lead to errors and instability in the crossbar circuit and may limit the inference accuracy of the crossbar circuit.

The present disclosure provides mechanisms for suppressing and reducing RTN in crossbar circuits. In some embodiments, programming an RRAM device in a crossbar circuit may involve programming the RRAM device to a target conductance value (e.g., by applying one or more programming voltages to the RRAM device). A controller may determine whether an RTN value associated with the RRAM device is within a predetermined range of acceptable RTN values. The RTN value may be, for example, an amplitude of a signal representative of the current flowing through the RRAM device. In response to determining that the RTN value is not within the predetermined range, the controller may cause a noise-reduction voltage to be applied to the RRAM device. For example, the controller may generate one or more digital signals for instructing one or more voltage generators to generate the noise-reduction voltage. The voltage generator(s) may generate the noise-reduction voltage based on the digital signals and may apply the noise-reduction voltage to the RRAM device.

The controller may then determine the conductance value of the RRAM device after the application of the first noise-reduction voltage and may program the RRAM device to the target conductance value if the conductance of the RRAM device does not match the target conductance value. The controller may then determine whether the RTN value of the RRAM device is within the predetermined range. The controller may apply one or more noise-reduction voltages until the RTN value associated with the RRAM device is within the predetermined range. As such, the mechanisms described herein may enable precise programming of the RRAM device.

FIG. 1 is a diagram illustrating an example crossbar circuit 100 in accordance with some embodiments of the present disclosure. As shown, crossbar circuit 100 may include a plurality of interconnecting electrically conductive wires, such as one or more row wires 111*a*, ..., 111*i*, ..., 111*n*, and column wires 113*a*, ..., 113*j*, ..., 113*m* for an n-row by m-column crossbar array. The crossbar circuit 100 may further include cross-point devices 120*a*, ..., 120*ij*, 120*z*, etc. The number of the column wires 113*a-m* and the number of the row wires 111*a-n* may or may not be the same. Crossbar circuit 100 may further include select lines 115*a*, 115*b*, ..., 115*n*. Each of the cross-point devices may connect a row wire, a column wire, and a select line. For example, the cross-point device 120ij may connect the row wire 111i and the column wire 113j. Each of the row wires 111a-n, column wires 113a-m, and select lines 115a-n may be a metal wire. In some embodiments, each row wire 111a-n may be a word line, and each column wire 113a-m may be a bit line. In some embodiments, each row wire 111a-n may be a bit line, and each column wire 113a-m may be a word line.

Crossbar circuit 100 may further include one or more voltage generators 161a, 161i, ..., 161n connected to the row wires 111a-n, voltage generators 163a, 163j, ..., 163m connected to the column wires 113a-m, voltage generators 165a, 165b, ..., 165n connected to the select lines 115a-n. Each voltage generator 161a-n, 163a-m, and 165a-n may include any suitable component for generating and providing voltage signals. A voltage generator 161a, 161i, ..., 161n may apply voltages to one or more cross-point devices 120a-z via a respective row wire 111a-n. A voltage generator 163a, 163j, ..., 163m may apply voltages to one or more cross-point devices 120a-z via a respective column wire 113a-m. A voltage generator 165a, 165b, ..., 165m may apply voltages to one or more cross-point devices 120a-z via a respective select line 115a-n.

Each cross-point device 120a-z may be and/or include any suitable device with programmable resistance, such as a phase-change memory (PCM) devices, floating gates, spintronic devices, ferroelectric devices, RRAM devices, etc. Each cross-point device 120a-z may be programmed to a suitable conductance value by applying suitable programming signals (e.g., suitable voltage signals or current signals) across the cross-point device. The resistance of each cross-point device may be electrically switched between a high-resistance state and a low-resistance state. Setting a cross-point device may involve switching the resistance of the cross-point from the high-resistance state to the low-resistance state. Resetting the cross-point device may involve switching the resistance of the cross-point from the low-resistance state to the high-resistance state.

Each cross-point device 120a-z may include one or more transistors may include an n-transistor-m-resistor (nTmR) configuration, where n and m denote the number of transistors and the number of programmable devices (e.g., RRAM devices) in the cross-point device, respectively. The transistor(s) may provide access control for the RRAM device in the cross-point device.

In some embodiments, one or more cross-point devices 120a-z may include a one-transistor-one-resistor (1T1R). For example, as shown in FIG. 1, a cross-point device 120a may include an RRAM device 121a and a transistor 123a that are connected in series. Transistor 123a may provide access control for RRAM device 121a. The transistor may include a gate terminal, a source terminal, and a drain terminal. In some embodiments, a first terminal of RRAM device 121a may be connected to the drain of transistor 123a. A second terminal of RRAM device 121a may be connected to row wire 111a. The source terminal of transistor 123a may be connected to column wire 113a. The gate terminal of transistor 123a may be connected to select line 115a. In one implementation, row wire 111a and column wire 113a may be a word line and a bit line, respectively. In another implementation, row wire 111a and column wire 113a may be a bit line and a word line, respectively.

Transistor 123a may function as a selector as well as a current controller and may set the current compliance to RRAM device 121a during the programming of RRAM device 121a. The gate voltage on transistor 123a can set current compliances to cross-point device 121a during programming and can thus control the conductance and analog behavior of cross-point device 120a. For example, when cross-point device 120a and/or RRAM device 121a is set from a high-resistance state to a low-resistance state, a set signal (e.g., a voltage signal, a current signal) may be provided via row wire 111a (or column wire 113a). Another voltage, also referred to as a select voltage or gate voltage, may be applied via select line 115a to the transistor gate of transistor 123a to open the gate and set the current compliance, while column wire 113a (or row wire 111a) may be grounded. When cross-point device 120a and/or RRAM device 121a is reset from the low-resistance state to the high-resistance state, a gate voltage may be applied to the gate of transistor 123a via select line 115a to open the transistor gate. Meanwhile, a reset signal may be applied to RRAM device 121a via column wire 113a (or row wire 111a), while row wire 111a (or column wire 113a) may be grounded. The set voltage and the reset voltage may have the same or different polarities.

RTN reading circuits 140a, 140j, ..., 140m may include any suitable circuitry for converting the current flowing through a respective column wire 113a, 113j, ..., 113m into an output signal. For example, each RTN reading circuit 140a-m may include a trans-impedance amplifier (TIA) (not shown) that may convert the current flowing through a respective column wire into a respective voltage signal. Each RTN reading circuit 140a-m may further include an analog-to-digital converter (ADC) (not shown) that may convert the voltage signal produced by its corresponding TIA into a digital output. In some embodiments, the outputs of the RTN reading circuits 140a-m may be provided to controller 150.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the sum of the currents passes through the activated cross-point devices on a respective column (also referred to as the "bit line current"), which may be read from the column. According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current (the "bit line current") is output via each column wire and may be accumulated according to Kirchhoff's current law. This may enable in-memory computing (IMC) via parallel multiplications and summations performed in the crossbar arrays.

Crossbar circuit 100 may be configured to perform vector-matrix multiplication (VMM). A VMM operation may be represented as Y=XA, wherein each of Y, X, A represents a respective matrix. More particularly, for example, input vector X may be mapped to the input voltage V of crossbar circuit 100. Matrix A may be mapped to conductance values G. The output current I may be read and mapped back to output results Y. In some embodiments, crossbar circuit 100 may be configured to implement a portion of a neural network by performing VMMs.

However, the conductance values G of the programmed RRAM devices may randomly switch between multiple levels under constant voltage over time, resulting in the occurrences of RTN. For example, as illustrated in FIGS. 2A-2E, the output current of an RRAM device not undergoing a noise-reduction process may randomly fluctuate under constant voltage over time. This may lead to errors and instability in the crossbar circuit and may limit the inference accuracy of the crossbar circuit.

Controller 150 may include any suitable hardware and/or software components for suppressing RTN in crossbar circuit 100. In some embodiments, controller 150 may include a processing device as described in connection with FIG. 6 below. Controller 150 may be and/or include a computer system 600 of FIG. 6. In one implementation, controller 150 may be implemented as a stand-alone device that is not part of crossbar circuit 100. In another implementation, controller 150 may be regarded as part of crossbar circuit 100.

Controller 150 may perform operations for suppressing RTN in crossbar circuit 100. For example, controller 150 may program the conductance of a selected cross-point device to a target conductance value. For example, controller 150 may provide instructions for generating and applying one or more programming voltages to one or more voltage generators (e.g., the voltage generators connected to the row wire and/or column wire connected to the selected cross-point device). The selected cross-point device may be regarded as being programmed to the target conductance value when a difference between the conductance of the selected cross-point device and the target conductance value is not greater than a predetermined threshold. Controller 150 may then determine whether an RTN value associated with the selected cross-point device is within a predetermined range of acceptable RTN values. The RTN value may be a feature (e.g., an amplitude) of the output of the RTN reading circuit 140a-m. In response to determining that the RTN value is within the predetermined range, controller 150 may conclude the programming of the selected cross-point device. In response to determining that the RTN value is not within the predetermined range, controller 150 may generate one or more instructions to cause the voltage generators 161a-n and/or 163a-m to generate a noise-reduction voltage and apply the noise-reduction voltage to the selected cross-point device via the row wire and/or the column wire connected to the selected cross-point device. Controller 150 may then determine the conductance value of the selected cross-point device after the application of the noise-reduction voltage. Controller 150 may program the selected cross-point device to the target conductance value if the conductance value of the selected cross-point device does not match the target conductance value. Controller 150 may apply one or more noise-reduction voltages until the RTN value associated with the RRAM device is within the predetermined range. As such, precise programming of the RRAM device can be achieved. In some embodiments, controller 150 may perform RTN reduction for crossbar circuit 100 by implementing method 400 of FIG. 4.

FIGS. 2A, 2B, 2C, 2D, and 2E are diagrams showing the output current of an RRAM device over time when a constant voltage is applied to the RRAM device. No noise-reduction process as described herein is performed on the RRAM device. As shown, the output current of the RRAM device randomly fluctuates under the constant voltage over time, indicating the presence of RTN.

FIGS. 3A, 3B, 3C, 3D, 3E, and 3F illustrate cross-sectional views of example RRAM devices in accordance with some embodiments of the present disclosure. RRAM devices 300a, 300b, and 300c may correspond to an RRAM device in an initial state, a low-resistance state, and a high-resistance state, respectively. RRAM device 300d corresponds to the RRAM device 300a including both complete and incomplete filaments. RRAM devices 300e and 300f correspond to RRAM device 300d after application of noise-reduction voltages.

Figure 3A:
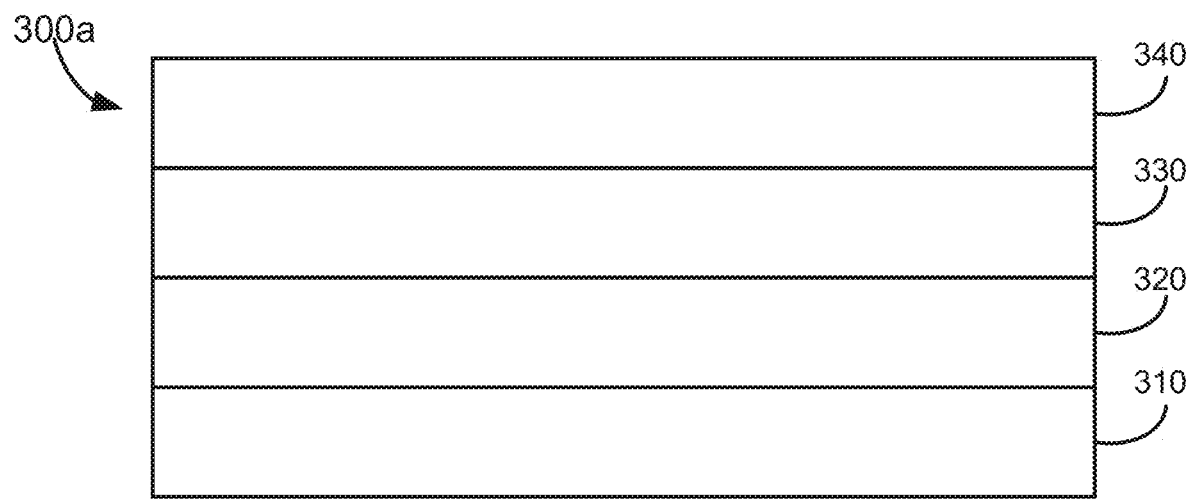
FIGS. 3A, 3B, 3C, 3D, 3E, and 3F illustrate cross-sectional views of example RRAM devices in accordance with some embodiments of the present disclosure.

As shown in FIG. 3A, RRAM device 300a may include a substrate 310, a first electrode 320, a switching oxide layer 330, and a second electrode 340. RRAM device 300a may further include one or more other components for implementing in-memory computing applications.

Substrate 310 may include one or more layers of any suitable material that may serve as a substrate for an RRAM device, such as silicon (Si), silicon dioxide ($SiO_2$), silicon nitride ($Si_3N_4$), aluminum oxide ($Al_2O_3$), aluminum nitride (AlN), etc. In some embodiments, substrate 310 may include diodes, transistors, interconnects, integrated circuits, etc. In some embodiments, the substrate may include a driving circuit including one or more electrical circuits (e.g., an array of electrical circuits) that may be individually controllable. In some embodiments, the driving circuit may include one or more complementary metal-oxide-semiconductor (CMOS) drivers.

First electrode 320 may be and/or include any suitable material that is electronically conductive and non-reactive to the switching oxide. For example, first electrode 320 may include platinum (Pt), palladium (Pd), iridium (Ir), titanium nitride (TiN), tantalum nitride (TaN), etc.

Switching oxide layer 330 may include one or more transition metal oxides, such as $TaO_x$, $HfO_x$, $TiO_x$, NbOx, ZrOx, etc., in binary oxides, ternary oxides, and high order oxides. In some embodiments, the chemical stability of the non-reactive material in first electrode 320 may be higher than that of the transition metal oxide(s) in switching oxide layer 330.

Second electrode 340 may include any suitable metallic material that is electronically conductive and reactive to the switching oxide. For example, the metallic material in second electrode 340 may include Ta, Hf, Ti, TiN, TaN, etc. Second electrode 340 may be reactive to the switching oxide and may have suitable oxygen solubility to adsorb some oxygen from the switching oxide and create oxygen vacancies in the switching oxide. In other words, the reactive metallic material(s) in second electrode 340 may have suitable oxygen solubility and/or oxygen mobility. In some embodiments, second electrode 340 may not only be able to create oxygen vacancies in switching oxide layer 330 (e.g., by scavenging oxygen) but may also function as an oxygen reservoir or source to the switching oxide layer 330 during cell programming.

Figure 3B:
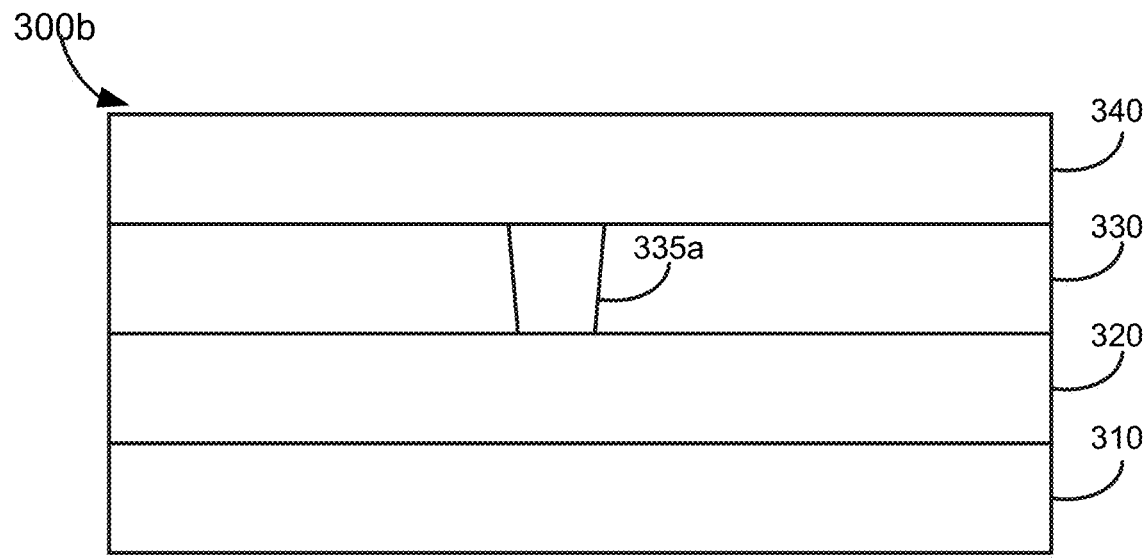
Figure 3C:
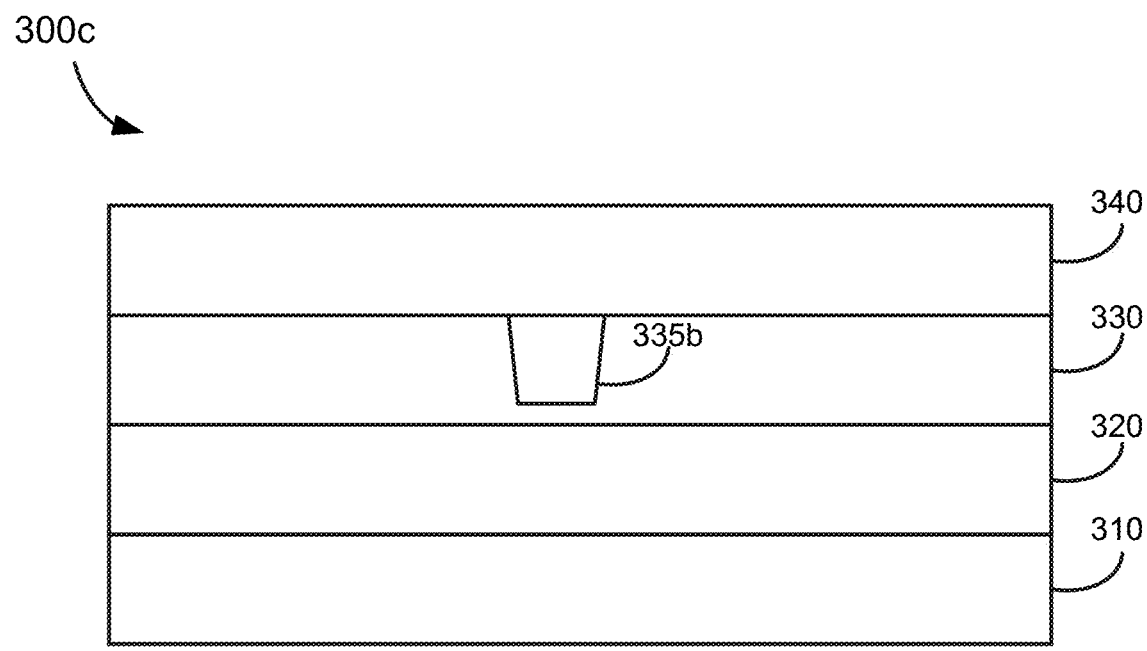

RRAM device 300a may have an initial resistance (also referred to herein as the "virgin resistance") after it is fabricated. The initial resistance of RRAM device 300a may be changed and RRAM device 300a may be switched to a state of a lower resistance via a forming process. For example, a suitable voltage or current may be applied to RRAM device 300a. The application of the voltage to RRAM device 300a may induce the metallic material(s) in the second electrode to absorb oxygen from the switching oxide layer 330 and create oxygen vacancies in the switching oxide layer 330. As a result, a conductive channel (e.g., a filament) that is oxygen vacancy rich may form in the switching oxide layer 330. For example, as illustrated in FIG. 3B, a conductive channel 335a may be formed in the switching oxide layer 330. As shown, conductive channel 335a may be formed from the second electrode 340 to the first electrode 320 across the switching oxide layer 330. RRAM device 300b may be reset to a high-resistance state. For example, a reset signal (e.g., a voltage signal or a current signal) may be applied to RRAM device 300b during a reset process. In some embodiments, the set signal and the reset signal may have opposite polarity, i.e., a positive signal and a negative signal, respectively. The application of the reset signal may cause oxygen to drift back to the switching oxide layer 330 and recombine with one or more of the oxygen vacancies. For example, an interrupted conductive channel 335b as shown in FIG. 3C may be formed in the switching oxide layer 330 during the reset process. As shown, the conductive channel may be interrupted with a gap between the interrupted conductive channel 335b and the first electrode 320. Conductive channel 335b does not continuously connect the first electrode 320 and the second electrode 340. RRAM device 300a-c may be electrically switched between the high-resistance state and the low-resistance state by applying suitable programming signals (e.g., voltage signals, current signals, etc.) to the RRAM device.

Figure 3D:
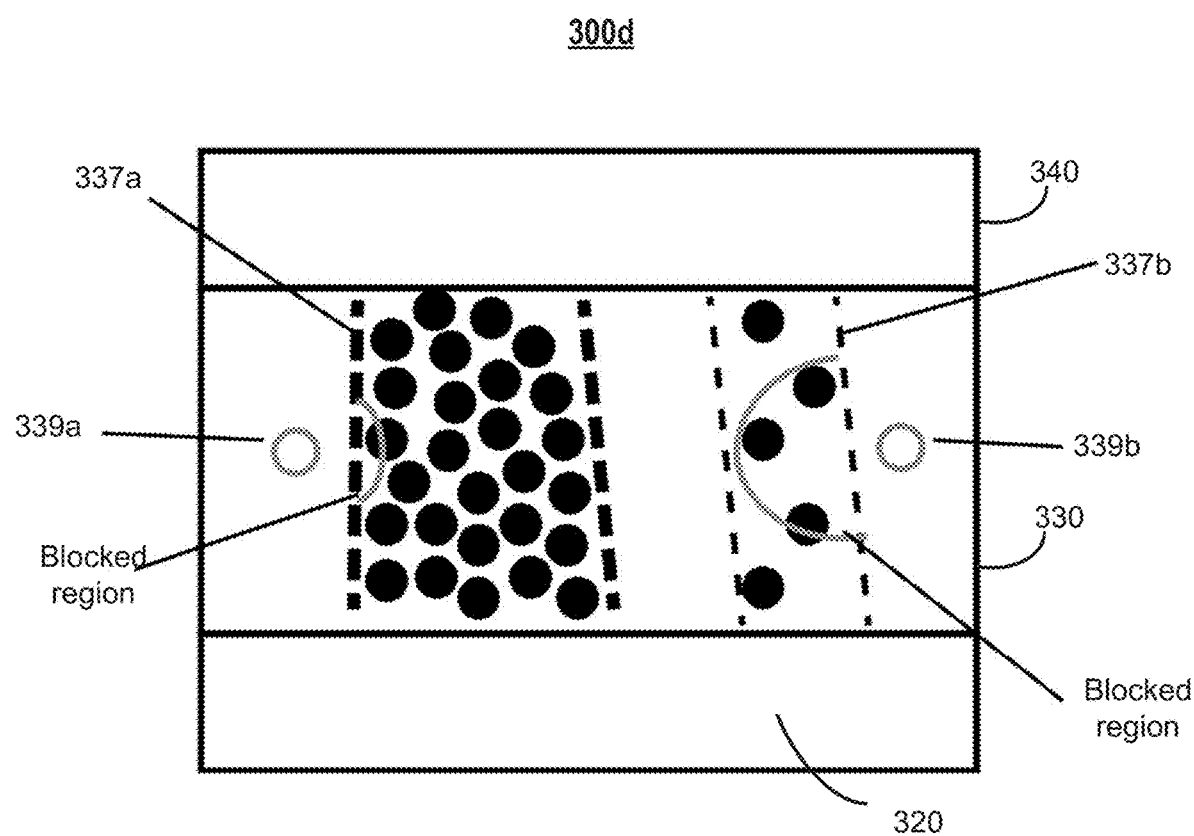

Referring to FIG. 3D, both complete filaments 337a and incomplete filaments 337b may form during the programming of RRAM device 300a in some embodiments. The incomplete filaments may be regarded as intermediate states between the pristine switching film and complete filaments. The incomplete filaments may contain some conductive species but may have a smaller size and higher resistance compared to the complete filaments. The conductivity of conductive channels in the switching oxide layer 330 is influenced by the shielding effect. When one or more charge trapping centers 339a, 339b, etc. exist in the switching oxide layer 330, they may trap charge occasionally, resulting in the occasional presence of shielding effects.

The shielding effects may have a limited impact on the conductance of a complete filament due to the decreasing shielding radius with an increasing density of free charge carriers. In complete conductive channels, where the density of free charge carriers is high, the shielding effect is negligible. However, the shielding effects may have a significant impact on the conductance of the incomplete channels due to the lower density of free charge carriers in the incomplete channels. Consequently, the conductance of the switching film changes during the switching between the trapping and de-trapping states, resulting in the presence of RTN.

The incomplete filaments may exhibit greater sensitivity to voltage input compared to the complete filaments. This is due to the lower presence of conductive species within an incomplete filament, making even a small movement of these species have a more pronounced impact on the characteristics of the incomplete filament. As a result, a voltage that is lower than the voltage required for programming the complete filaments may be used to regulate the behavior of incomplete filaments.

Figure 3E:
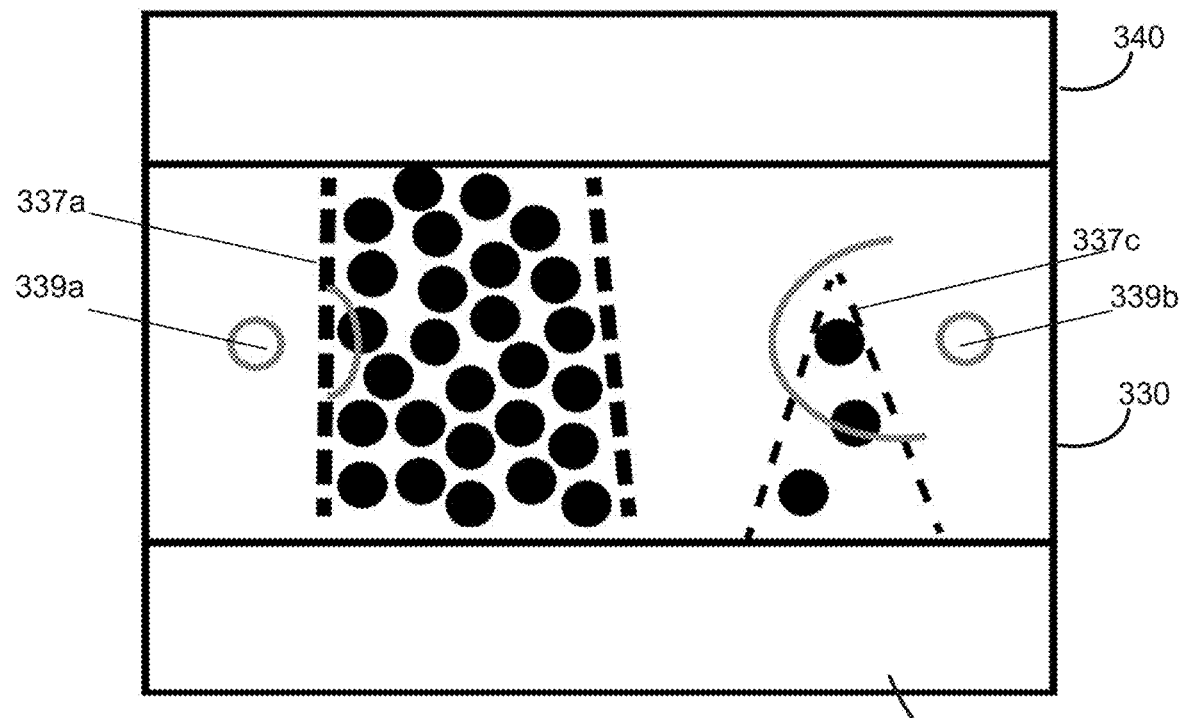
Figure 3F:
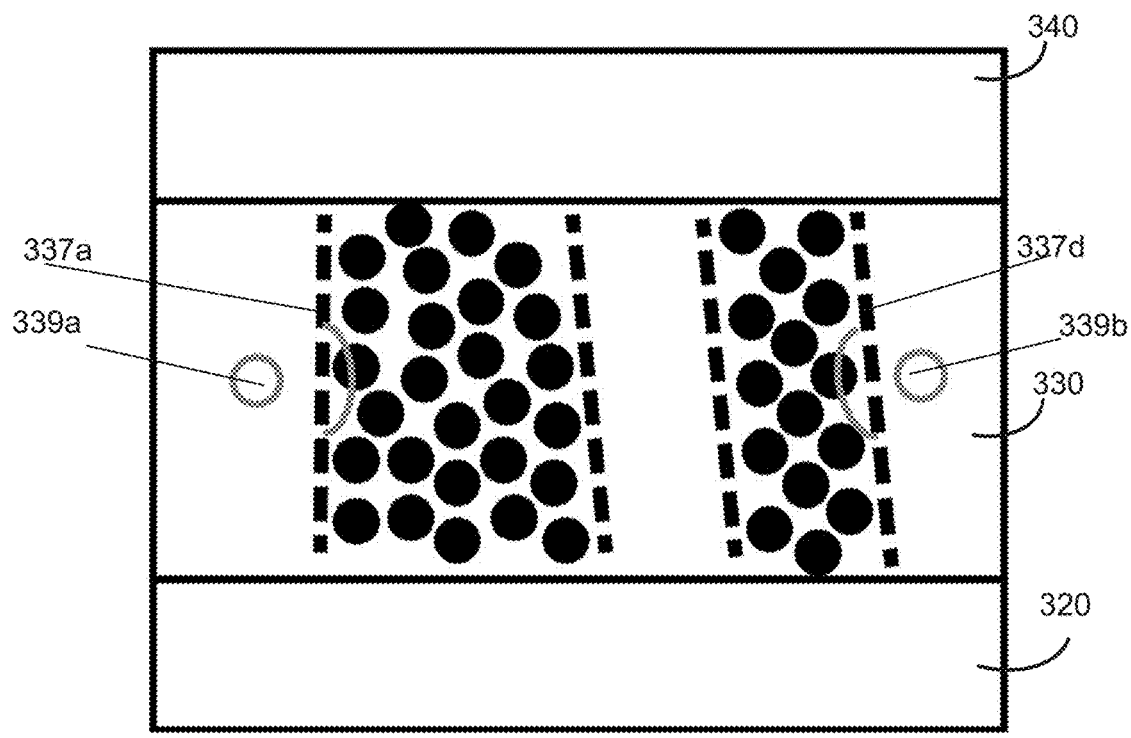

For example, as shown in FIG. 3E, applying a noise-reduction voltage (e.g., a sub-threshold voltage that is lower than the threshold voltage of a transistor that provides access control for the RRAM device) may be applied to the RRAM device in the RESET direction, the incomplete filaments 337b tend to break (shown as incomplete filaments 337c) and thus no longer leads to RTN. As another example, as shown in FIG. 3F, applying a noise-reduction voltage to the RRAM device in the SET direction may reinforce the incomplete filaments to form filaments 337d, reducing their sensitivity to the shielding effect.

Figure 4:
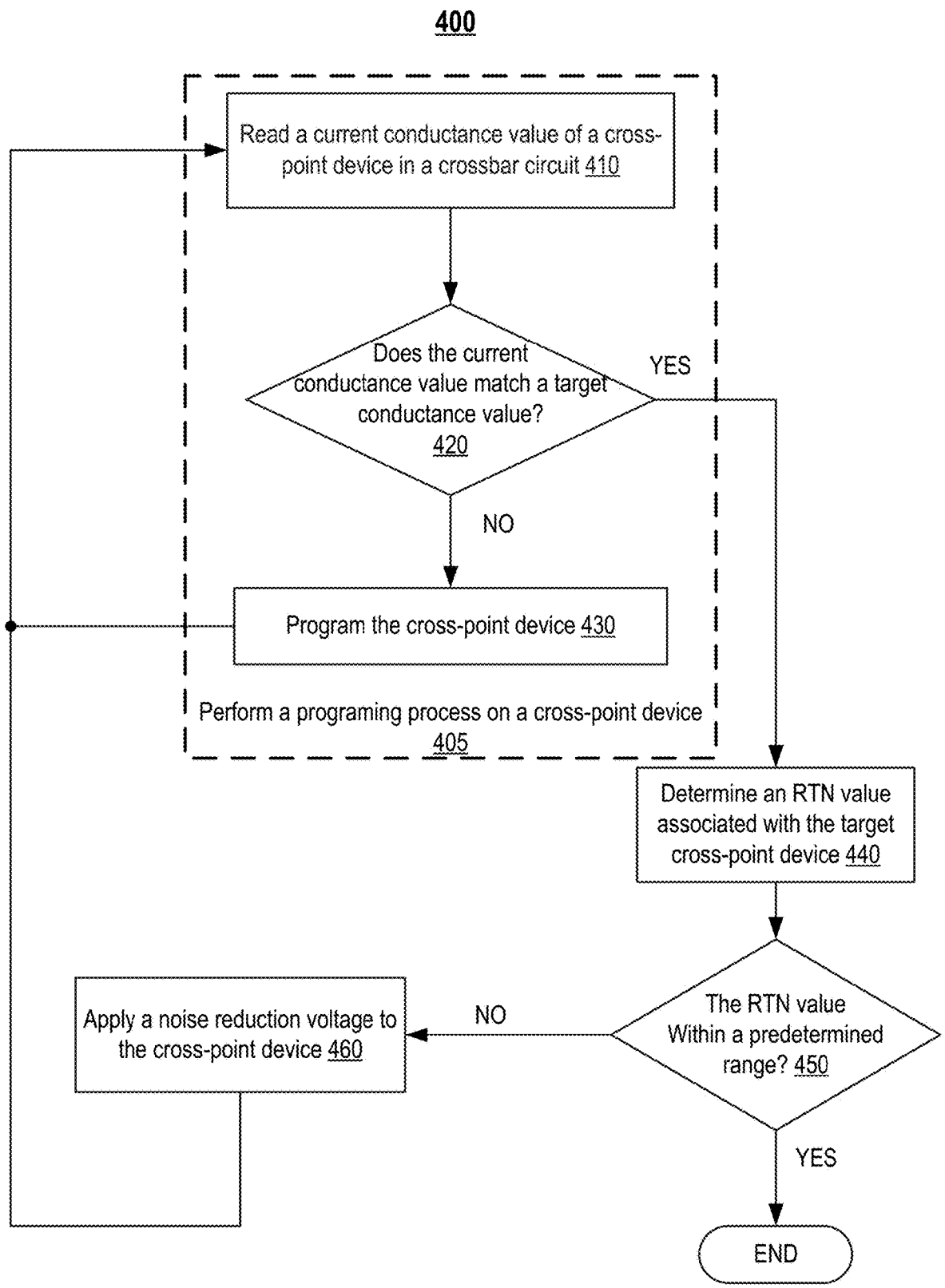
FIG. 4 is a flowchart illustrating an example method for programming a crossbar circuit in accordance with some embodiments of the present disclosure.

FIG. 4 is a flowchart illustrating an example method 400 for programming a crossbar circuit in accordance with some embodiments of the present disclosure. The crossbar circuit may include a plurality of bit lines intersecting with a plurality of word lines and a plurality of cross-point devices. Each of the plurality of the cross-point devices is connected to at least one of the word lines and at least one of the bit lines. The crossbar circuit may be crossbar circuit 100 of FIG. 1. Method 400 may be executed to program the conductance of a cross-point device (e.g., an RRAM device 120a-z) and/or an RRAM device (e.g., an RRAM device 121a-z) of the crossbar circuit to a target conductance value and to reduce and/or minimize RTN in the crossbar circuit.

At 405, a first programming process may be performed to program a cross-point device of the crossbar circuit to a target conductance value. The cross-point device (e.g., a cross-point device 120a-z of FIG. 1) may include at least one RRAM device. For example, the cross-point device may be programmed by performing operations depicted in blocks 410, 420, and 430 iteratively.

At 410, a current conductance value of the cross-point device may be read using suitable circuitry. For example, the current conductance value of the target cross-point device may be determined based on the output current of the target cross-point device (e.g., the current flowing through the cross-point device when the cross-point device is selected) and an input voltage applied to the cross-point device.

At 420, a processing device may compare the current conductance value of the cross-point device to a target conductance value to determine whether the current conductance value matches the target conductance value. The current conductance value may be regarded as matching the target conductance value when a difference between the current conductance value and the target conductance value is not greater than a predetermined threshold.

In some embodiments in which the current conductance value does not match the target conductance value ("NO" at 420), the target cross-point device may be programmed based on the comparison result at 430. For example, in some embodiments in which the current conductance value is higher than the target conductance value, a reset operation may be performed on the target cross-point device. More particularly, for example, the processing device may provide, to one or more voltage generators, one or more instructions and/or digital signals for applying one or more reset voltages to the target cross-point device. The voltage generator(s) may then generate the reset voltage based on the instruction and/or digital signals and may apply the reset voltage to the target cross-point device. As another example, in some embodiments in which the current conductance value is lower than the target conductance value, a set operation may be performed on the target cross-point device. More particularly, for example, the processing device may provide, to the voltage generators, one or more instructions and/or digital signals for applying one or more set voltages to the target cross-point device. The voltage generator(s) may then generate the set voltage based on the instruction and/or digital signals and may apply the set voltage to the target cross-point device. Method 400 may loop back to 410 after executing 430. The programming of the cross-point device may be performed by executing blocks 410, 420, and 430 iteratively until the conductance of the cross-point device (the conductance of the RRAM device in the cross-point device) matches the target conductance value.

In some embodiments in which the current conductance value matches the target conductance value, the controller may proceed to 440 and may determine an RTN value associated with the cross-point device. The RTN value may be, for example, one or more features (e.g., an amplitude) of a signal representative of the current following through the cross-point device, such as an output of the RTN reading circuit 140*a-m* of FIG. 1.

At 450, the processing device may determine whether the RTN value associated with the target cross-point device is within a predetermined range of acceptable RTN values. In view of a determination that the current RTN value is not within the predetermined range of acceptable RTN values, a noise-reduction voltage (also referred to as "a first noise-reduction voltage") may be applied to the target cross-point device at 460. The noise-reduction voltage may include one or more pulses (also referred to as the "noise-reduction pulses") and may be lower than a threshold voltage required for programming (e.g., setting, resetting, etc.) the RRAM device (e.g., RRAM device 121*a* of FIG. 1). The noise-reduction voltage is lower than the programming voltages used to program the target cross-point device to the target conductance value.

To apply the noise-reduction voltage to the target cross-point device, the processing device may generate one or more instructions and/or digital signals for generating the noise-reduction voltage and may provide the instructions to one or more voltage generators connected to the word line and/or the bit line connected to the target cross-point device. The voltage generators may then generate the noise-reduction voltage based on the instructions and/or digital signals. The noise-reduction voltage may be applied to the target cross-point device via the word line and/or the bit line connected to the target cross-point device.

The processing device may then return to 410 and may determine the conductance value of the RRAM device of the target cross-point device after the application of the first noise-reduction voltage and may program the RRAM device (e.g., by applying one or more programming voltages) to the target conductance value if the conductance value of the RRAM device does not match the target conductance value. One more additional programming voltages may be applied to the target cross-point device until the conductance of the RRAM device matches the target conductance value.

The processing device may then determine a second RTN value associated with the RRAM device (e.g., the amplitude of a second signal representative of the current passing through the RRAM device and/or the target cross-point device). If the second RTN value associated with the RRAM device is not within the predetermined range of accepted RTN values, a second noise-reduction voltage may be applied to the target cross-point device and/or the RRAM device. One or more additional noise-reduction voltages may be applied to the RRAM device until the second RTN value associated with the target cross-point device is within the predetermined range of accepted RTN values (e.g., "YES" at 450). The target cross-point device may then be regarded as being successfully programmed and the controller may conclude the programming of the target cross-point device.

Figure 5A:
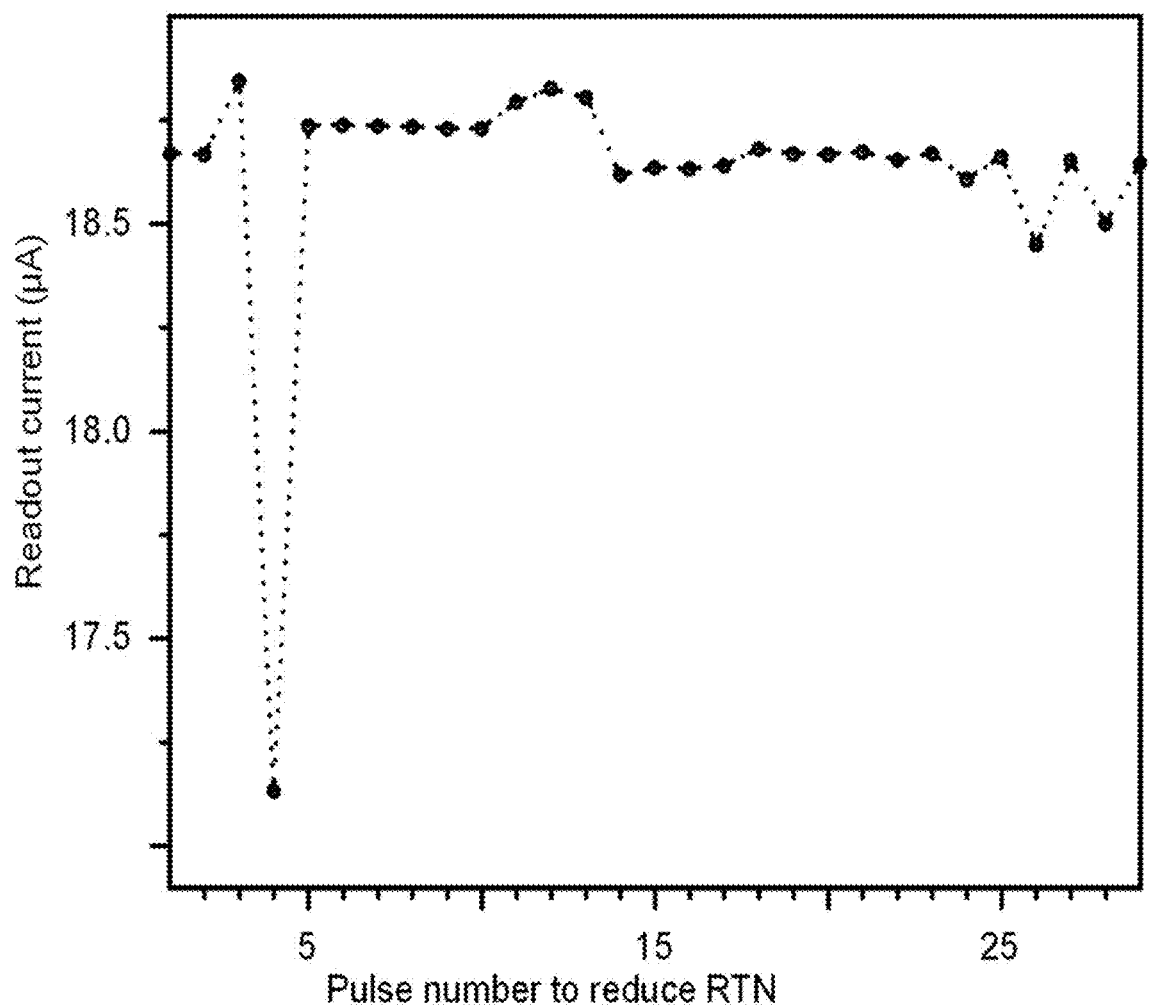
FIG. 5A is a diagram illustrating the relationship between the number of noise-reduction pulses applied to an RRAM device and the probability of successful RTN reduction.

FIG. 5A is a diagram 500*a* illustrating the relationship between the number of noise-reduction pulses applied to an RRAM device and the probability of successful RTN reduction. The effect of the noise-reduction voltage may have some randomicity due to ion movement. As shown, applying a suitable number of voltage pulses to the RRAM device may address this issue and may cause the probability of achieving successful outcomes to approach near-certainty levels.

Figure 5B:
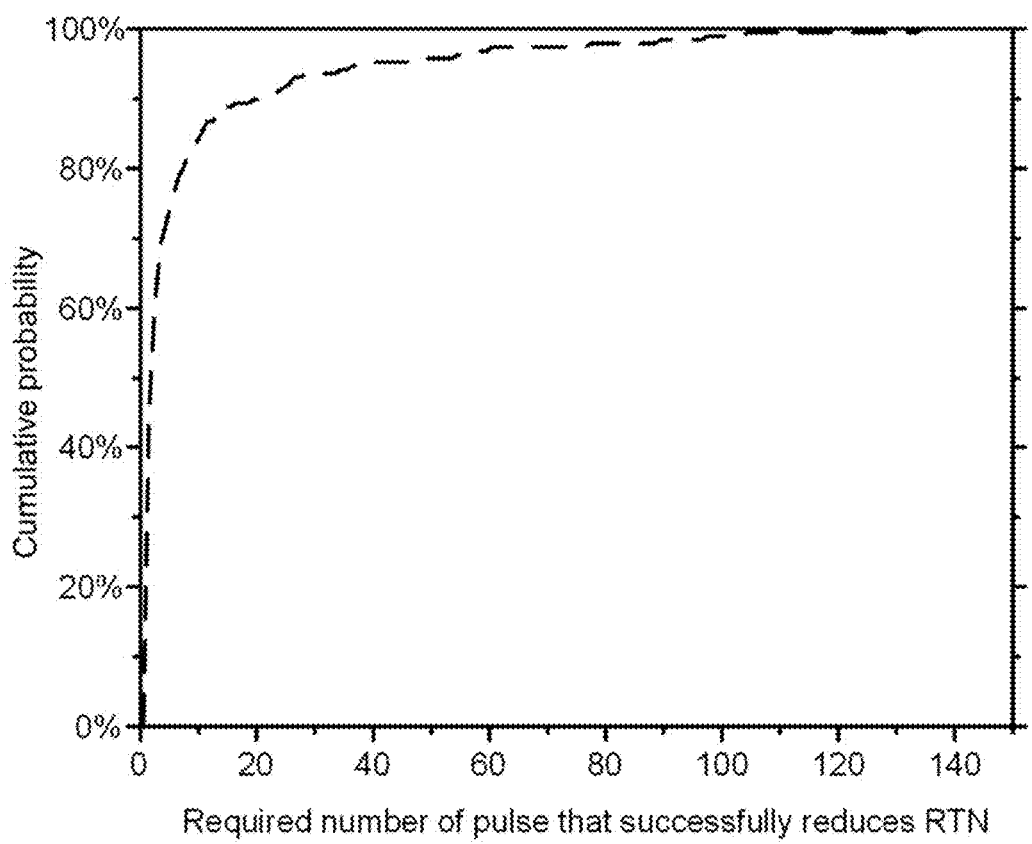
FIG. 5B is a diagram illustrating the relationship between the number of noise-reduction pulses applied to the RRAM device and the output current of the RRAM device.

FIG. 5B is a diagram 500*b* illustrating the relationship between the number of noise-reduction pulses applied to the RRAM device and the output current of the RRAM device. As shown, the RTN reduction operations as described herein may have the potential to modify the overall conductance of the RRAM device. However, the resulting change remains within acceptable tolerances. In some embodiments in which the change exceeds the tolerance threshold, the RRAM device enters fine-tuning feedback tuning cycles (e.g., iteratively executing 450, 460, 410, 420, 430, etc. as described in connection with FIG. 4), allowing for reprogramming back to the desired target conductance level.

Figure 6:
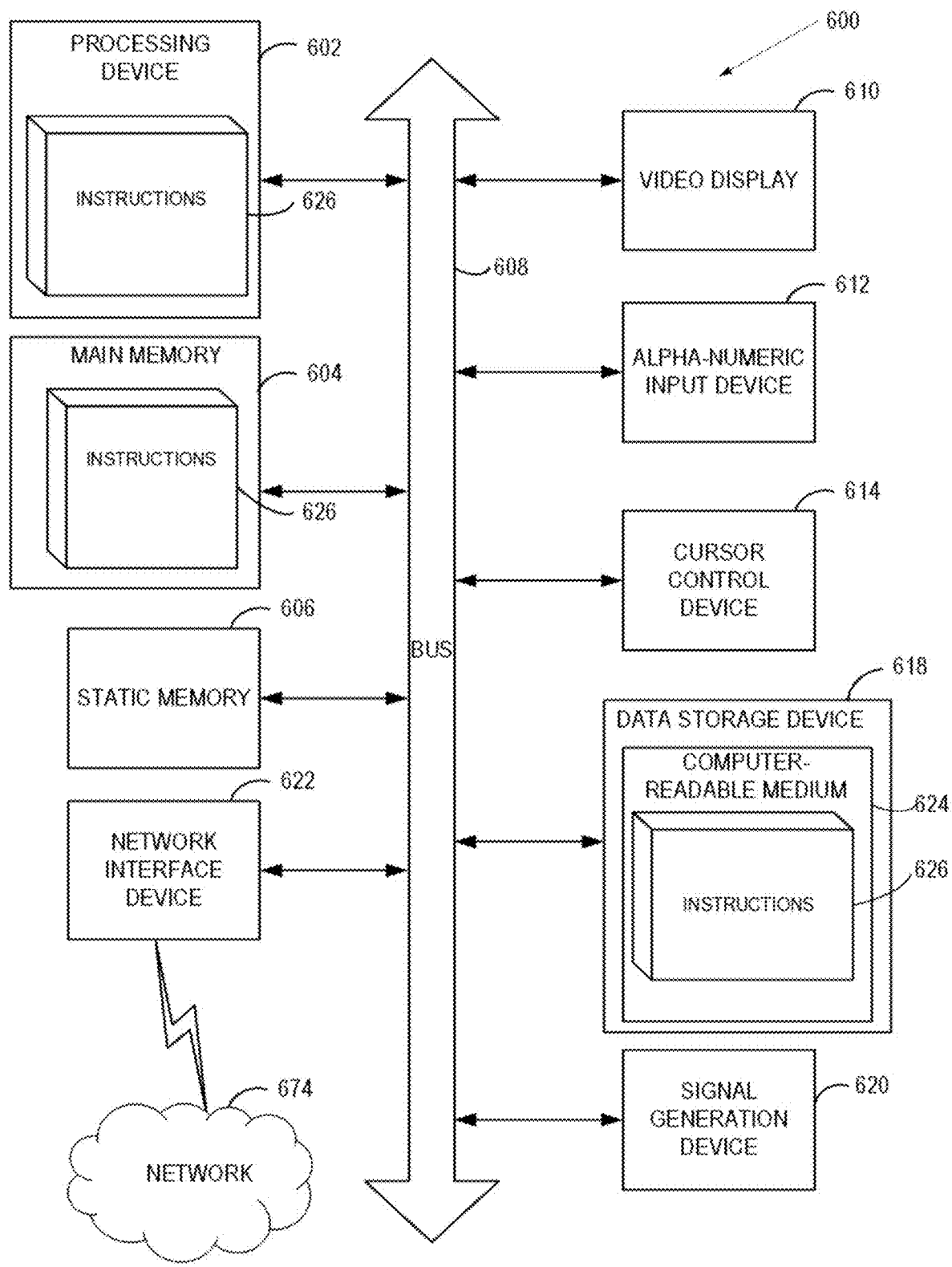
FIG. 6 illustrates a diagrammatic representation of a computer system in accordance with some embodiments of the present disclosure.

FIG. 6 illustrates a diagrammatic representation of a machine in the exemplary form of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, or the Internet. The machine may operate in the capacity of a server or a client machine in client-server network environment or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 600 includes a processing device (processor) 602, a main memory 604 (e.g., read-only memory (ROM), flash memory, dynamic random-access memory (DRAM) such as synchronous DRAM (SDRAM) or Rambus DRAM (RDRAM), etc.), a static memory 606 (e.g., flash memory, static random-access memory (SRAM), etc.), and a data storage device 618, which communicate with each other via a bus 608.

Processing device 602 represents one or more general-purpose processing devices such as a microprocessor, central processing unit, or the like. More particularly, the processing device 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 602 may also be one or more special-purpose processing devices such as an application specific integrated circuit (ASIC), a field programmable gate array (FPGA), a digital signal processor (DSP), a network processor, or the like. The processing device 602 is configured to execute instructions 626 for performing the operations and steps discussed herein.

The computer system 600 may further include a network interface device 622. The computer system 600 also may include a video display unit 610 (e.g., a liquid crystal display (LCD), a cathode ray tube (CRT), or a touch screen), an alphanumeric input device 612 (e.g., a keyboard), a cursor control device 614 (e.g., a mouse), and a signal generation device 620 (e.g., a speaker).

The data storage device 618 may include a computer-readable storage medium 624 on which is stored one or more sets of instructions 626 (e.g., software) embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting computer-readable storage media. Instructions 626 may further be transmitted or received over a network 674 via the network interface device 622.

In one embodiment, instructions 626 include instructions for implementing a processing device for reducing RTN in crossbar circuits, which may correspond to controller 150 described with respect to FIG. 1, and/or a software library containing methods as described in connection with FIG. 4. While the computer-readable storage medium 624 is shown in an exemplary implementation to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media, and magnetic media.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or storage media.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A method for programming a crossbar circuit, comprising:
    performing a first programming process to program a cross-point device of the crossbar circuit to a target conductance value, wherein at least one programming voltage is applied to the cross-point device during the first programming process, wherein the cross-point device comprises a resistive random-access memory (RRAM) device;
    determining, by a processing device, a first random telegraph noise (RTN) value associated with the RRAM device; and
    in view of a determination that the first RTN value associated with the RRAM device is not within a predetermined range of acceptable RTN values, applying a first noise-reduction voltage to the cross-point device, wherein the at least one programming voltage is higher than the first noise-reduction voltage.

2. The method of claim 1, further comprising generating, by the processing device, a digital signal for instructing a voltage generator to generate the first noise-reduction voltage.

3. The method of claim 1, wherein the first RTN value associated with the cross-point device comprises a feature of a signal representative of a current flowing through the cross-point device.

4. The method of claim 3, further comprising generating the signal representative of the current flowing through the cross-point device using a trans-impedance amplifier.

5. The method of claim 3, wherein the feature of the signal representative of the current flowing through the cross-point device comprises an amplitude.

6. The method of claim 1, further comprising:
performing a second programming process to program the RRAM device to the target conductance value after the application of the first noise-reduction voltage to the cross-point device;
determining, by the processing device, a second random telegraph noise (RTN) value associated with the RRAM device; and
in view of a determination that the second RTN value associated with the RRAM device is not within the predetermined range of acceptable RTN values, applying a second noise-reduction voltage to the cross-point device.

7. The method of claim 1, further comprising performing one or more additional programming processes and applying one or more additional noise-reduction voltages to the cross-point device until the conductance of the cross-point device matches the target conductance value and an RTN value associated with the cross-point device is within the range of acceptable RTN values.

8. A system comprising:
a processing device to:
perform a first programming process to program a cross-point device of a crossbar circuit to a target conductance value, wherein at least one programming voltage is applied to the cross-point device during the first programming process, wherein the cross-point device comprises a resistive random-access memory (RRAM) device;
determine a first random telegraph noise (RTN) value associated with the RRAM device; and
in response to determining that the first RTN value associated with the RRAM device is not within a predetermined range of acceptable RTN values, cause a first noise-reduction voltage to be applied to the cross-point device, wherein the at least one programming voltage is higher than the first noise-reduction voltage.

9. The system of claim 8, wherein, to cause the first noise-reduction voltage to be applied to the cross-point device, the processing device is to generate at least one digital signal for instructing a voltage generator to generate the first noise-reduction voltage.

10. The system of claim 8, wherein the first RTN value associated with the RRAM device comprises a feature of a signal representative of a current flowing through the cross-point device.

11. The system of claim 10, wherein the signal representative of the current flowing through the cross-point device is generated using a trans-impedance amplifier.

12. The system of claim 10, wherein the feature of the signal representative of the current flowing through the cross-point device comprises an amplitude.

13. The system of claim 8, wherein the processing device is further to:
perform a second programming process to program the RRAM device to the target conductance value after the application of the first noise-reduction voltage to the cross-point device;
determine a second random telegraph noise (RTN) value associated with the RRAM device; and
in response to determining that the second RTN value associated with the RRAM device is not within the predetermined range of acceptable RTN values, cause a second noise-reduction voltage to be applied to the cross-point device, wherein the second noise-reduction voltage is not greater than a threshold voltage of a transistor connected to the RRAM device.

14. The system of claim 8, wherein the processing device is further to perform one or more additional programming processes and cause one or more additional noise-reduction voltages to be applied to the cross-point device until the conductance of the cross-point device matches the target conductance value and an RTN value associated with the cross-point device is within the range of acceptable RTN values.

15. A non-transitory computer-readable storage medium including instructions that, when accessed by a processing device, cause the processing device to:
perform a first programming process to program a cross-point device of a crossbar circuit to a target conductance value, wherein at least one programming voltage is applied to the cross-point device during the first programming process, wherein the cross-point device comprises an RRAM device;
determine, by the processing device, a first random telegraph noise (RTN) value associated with the RRAM device; and
in response to determining that the first RTN value associated with the RRAM device is not within a predetermined range of acceptable RTN values, cause a first noise-reduction voltage to be applied to the cross-point device, wherein the at least one programming voltage is higher than the first noise-reduction voltage.

16. The non-transitory computer-readable storage medium of claim 15, wherein, to cause the first noise-reduction voltage to be applied to the cross-point device, the processing device is to generate at least one digital signal for instructing a voltage generator to generate the first noise-reduction voltage.

17. The non-transitory computer-readable storage medium of claim 15, wherein the first RTN value associated with the RRAM device comprises a feature of a signal representative of a current flowing through the cross-point device.

18. The non-transitory computer-readable storage medium of claim 17, wherein the signal representative of the current flowing through the cross-point device is generated using a trans-impedance amplifier.

19. The non-transitory computer-readable storage medium of claim 17, wherein the feature of the signal representative of the current flowing through the cross-point device comprises an amplitude.

20. The non-transitory computer-readable storage medium of claim 15, wherein the processing device is further to:
perform a second programming process to program the RRAM device to the target conductance value after the application of the first noise-reduction voltage to the cross-point device;

determine a second random telegraph noise (RTN) value associated with the RRAM device; and in response to determining that the second RTN value associated with the RRAM device is not within the predetermined range of acceptable RTN values, cause a second noise-reduction voltage to be applied to the cross-point device, wherein the second noise-reduction voltage is not greater than a threshold voltage of a transistor connected to the RRAM device.

* * * * *